United States Patent [19]

Roth et al.

[11] Patent Number: 5,445,107
[45] Date of Patent: Aug. 29, 1995

[54] SEMICONDUCTOR DEVICE AND METHOD OF FORMATION

[75] Inventors: Scott S. Roth; Howard C. Kirsch, both of Austin, Tex.

[73] Assignee: Motorola, Inc., Schaumburg, Ill.

[21] Appl. No.: 155,607

[22] Filed: Nov. 22, 1993

[51] Int. Cl.⁶ ............................................. C30B 1/02
[52] U.S. Cl. ........................................ 117/8; 117/9; 117/10; 437/21; 437/61; 437/228
[58] Field of Search ................ 437/225, 228, 21, 61, 437/62, 4; 117/8, 9, 10

[56] References Cited

U.S. PATENT DOCUMENTS

| | | | |
|---|---|---|---|
| 4,874,718 | 10/1989 | Inoue | 437/62 |
| 4,925,805 | 5/1990 | Van Ommen et al. | 437/21 |
| 5,060,035 | 10/1991 | Nishimura et al. | 357/23.7 |

OTHER PUBLICATIONS

Hatalis et al., "Solid Phase Epitaxy of LPCVD Amorphous Silicon Films," Journal Of The Electrochemical Society, vol. 134, No. 10, Oct. 1987, pp. 2536–2540.
Hopper et al., "Improvement in the thickness uniformity of silicon-on-insulator layers . . . " Journal of Applied Physics, Feb. 15, 1991, pp. 2183–2189.
Ipri et al., "Mono/Poly Technology for Fabricating Low–Capacitance CMOS Integrated Circuits," IEEE Transactions On Electron Devices, vol. 35, No. 8, Aug. 1988, pp. 1382–1383.
Schubert et al., "Confined Lateral Selective Epitaxial Growth of Silicon . . . ," IEEE Electron Device Letters, vol. 11, No. 5, May 1990, pp. 181–183.
Friedrich et al., "Interface Characterization of Silicon Epitaxial Lateral Growth over . . . " IEEE Electron Device Letters, vol. 10, No. 4, Apr. 1989, pp. 144–146.

*Primary Examiner*—R. Bruce Breneman
*Attorney, Agent, or Firm*—Kent J. Cooper

[57] ABSTRACT

A silicon-on insulator film (38) is formed by solid phase epitaxial re-growth. A layer of amorphous silicon (36) is formed such that it is only in direct contact with an underlying portion of a silicon substrate (12). The layer of amorphous silicon (36) is subsequently annealed to form a monocrystalline layer of epitaxial silicon (38). Because the amorphous silicon layer (36) is in contact with only the silicon substrate (12), during the re-growth process, the resulting epitaxial layer (38) is formed with a reduced number of crystal defects. The resulting epitaxial silicon layer (38) may then be used to form semiconductor devices.

13 Claims, 3 Drawing Sheets

SEMICONDUCTOR DEVICE AND METHOD OF FORMATION

FIELD OF THE INVENTION

This invention relates generally to semiconductor devices and more specifically to a method for forming a semiconducting layer of material and a device therein.

BACKGROUND OF THE INVENTION

In order to fabricate integrated circuits with high device packing densities the semiconductor industry is continually decreasing device dimensions. Reduced device dimensions, however, can also adversely effect device reliability and performance. For example, device parasitics, such as latch-up, hot electron effects, and short channel effects, degrade both the performance and the reliability of semiconductor devices with submicron geometries. These degradation effects, however, can be minimized by fabricating semiconductor devices in silicon-on-insulator (SOI) films. Although SOI films are attractive from a device degradation perspective, current processing techniques often result in the formation of SOI films that have a high crystal defectivity. Semiconductor devices fabricated with these defective SOI films subsequently exhibit poor electrical characteristics, and thus the use of SOI films in the fabrication of high density integrated circuits has been limited.

One method proposed to form a SOI film is solid phase epitaxial re-growth. In this approach, an insulating layer of silicon dioxide is formed over a silicon substrate, and then it is subsequently patterned so that a portion of the silicon substrate is exposed. A layer of amorphous silicon is then deposited over the patterned silicon dioxide layer such that it is in contact with the exposed portion of the silicon substrate. The silicon substrate is subsequently annealed and the amorphous silicon layer is transformed into monocrystalline silicon layer by solid phase epitaxial re-growth. The silicon substrate, which contacts the amorphous silicon layer, acts as epitaxial seed for the re-growth process. The resulting epitaxial film, however, has a high density of crystal defects because the epitaxial re-growth process occurs in a non-uniform manner over the silicon dioxide layer. In addition, silicon dioxide and amorphous silicon have different thermal coefficients of expansion, and thus stress defects are also generated in the epitaxial silicon layer during its formation.

Epitaxial lateral overgrowth (ELO) is another method that has been proposed to form a SOI film. As in the previous technique, a layer of silicon dioxide is formed over a silicon substrate and then an opening is formed through it so that a portion of the silicon substrate is exposed. Silicon is then epitaxially deposited in the opening using the exposed portion of the substrate as an epitaxial seed. The deposition process is continued until the opening is filled and epitaxial silicon has laterally overgrown the patterned silicon dioxide layer. The resulting epitaxial film, however, also has a high density of crystal defects because the epitaxial deposition process is adversely effected by the silicon dioxide layer during the overgrowth process.

Accordingly, a need exists for a low defectivity SOI film that allows high density integrated circuits to be fabricated.

SUMMARY OF THE INVENTION

The previously mentioned problems with integrated circuits fabricated with SOI films are overcome by the present invention. In one embodiment of the invention a semiconducting layer of material is formed by providing a semiconductor substrate having a major surface. A sacrificial mask is formed overlying a first portion of the major surface. The sacrificial mask also has an opening that defines a second exposed portion of the major surface. A layer of amorphous silicon is formed within the opening such that it abuts the second exposed portion of the major surface. The sacrificial mask is then removed and the layer of amorphous silicon is subsequently annealed to form an epitaxial silicon layer. Other aspects of the invention involve methods for making semiconductor devices and device structures.

These and other features, and advantages, will be more clearly understood from the following detailed description taken in conjunction with the accompanying drawings. It is important to point out that the illustrations, may not necessarily be drawn to scale, and that there may be other embodiments of the present invention that are not specifically illustrated.

DETAILED DESCRIPTION OF A PREFERRED EMBODIMENT

Figure 1:
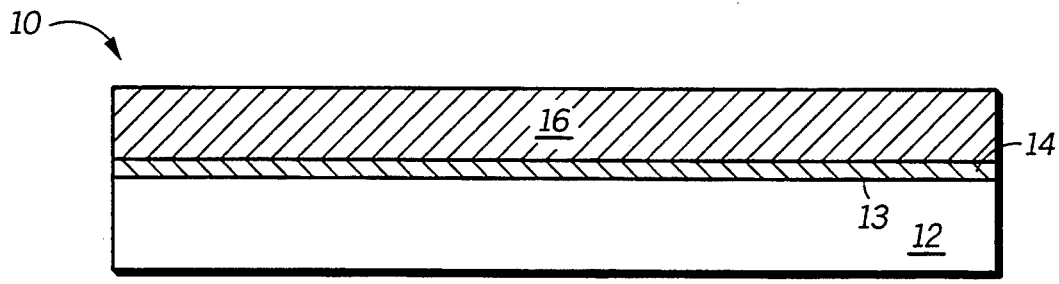
FIGS. 1–13 illustrate, in cross-section, process steps in accordance with one embodiment of the invention.

FIGS. 1 through 13 illustrate, in cross-section, process steps in accordance with one embodiment of the invention wherein a semiconducting layer of material is formed and a semiconductor device is formed therein. Shown in FIG. 1 is a portion 10 of an integrated circuit structure comprising a semiconductor substrate 12 having a major surface 13, a buffer layer 14, and a first sacrificial layer 16. Semiconductor substrate 12 is preferably a monocrystalline silicon substrate. Alternatively, semiconductor substrate 12 may also be a silicon on insulator substrate, a silicon on sapphire substrate, a germanium substrate, a gallium arsenide substrate, an indium phosphide substrate, or the like. Buffer layer 14 is preferably a layer of silicon dioxide, which is formed by thermally oxidizing semiconductor substrate 12. Alternatively, buffer layer 14 may be chemical vapor deposited silicon dioxide. In accordance with a preferred embodiment, first sacrificial layer 16 is preferably chemical vapor deposited silicon nitride. Alternatively, first sacrificial layer 16 may also be another material, such as silicon oxynitride or photoresist.

Figure 2:
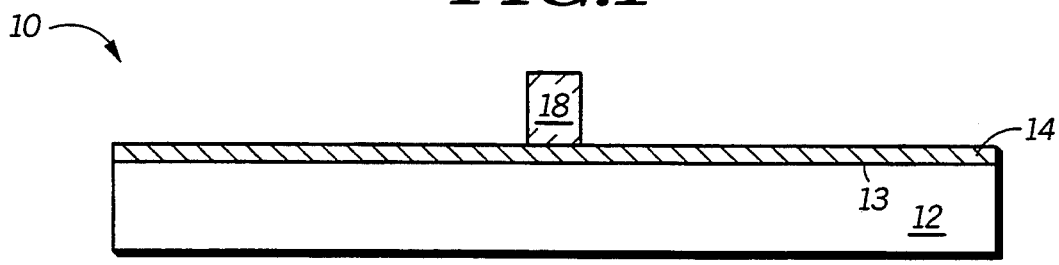

In FIG. 2, first sacrificial layer 16 is patterned to form a first patterned sacrificial layer 18 that overlies buffer layer 14. First patterned sacrificial layer 18 may be formed using standard photolithographic patterning and etching processes. Alternatively, if first sacrificial layer 16 is a light sensitive material such as photoresist, then first patterned sacrificial layer 18 may be formed using just conventional photolithographic patterning processes.

Figure 3:
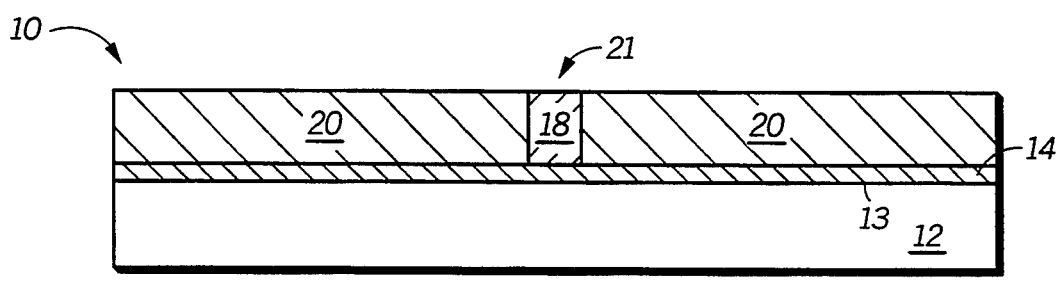

In FIG. 3, a second sacrificial layer 20 is formed over buffer layer 14 such that a top portion 21 of first patterned sacrificial layer 18 is exposed. In accordance with a preferred embodiment, second sacrificial layer 20 is formed by depositing a layer of silicon dioxide over semiconductor substrate 12 such that first patterned sacrificial layer 18 is initially covered. In a subsequent step, a portion of the silicon dioxide layer is then selectively removed in order to planarize the silicon dioxide layer and to expose top portion 21 of first patterned sacrificial layer 18. The silicon dioxide layer may be deposited using conventional deposition techniques such as chemical vapor deposition, plasma enhanced chemical vapor deposition, spin on deposition, or the like. In addition, the dielectric layer may be planarized using conventional plasma etching techniques, chemical mechanical polishing techniques or a combination thereof. Alternatively, second sacrificial layer 20 may be formed using ECR deposition techniques such that top portion 21 of patterned sacrificial layer 18 is left exposed after deposition.

Figure 4:
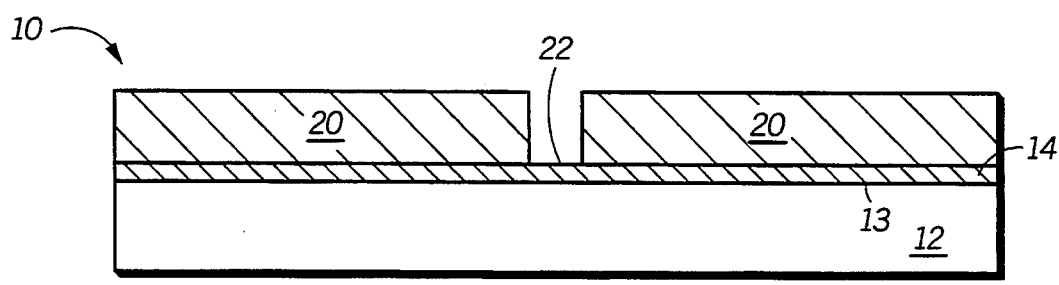

In FIG. 4, first patterned sacrificial layer 18 is then selectively removed to expose a portion 22 of buffer layer 14. In accordance with a preferred embodiment, first patterned sacrificial layer 18 may be selectively removed using a wet etchant such as phosphoric acid. Alternatively, first patterned sacrificial layer 18 may also be selectively removed using conventional dry etching techniques.

Figure 5:
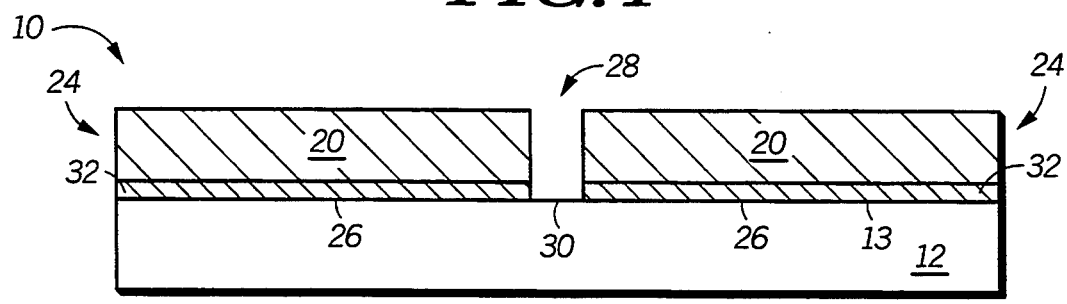

In FIG. 5, portion 22 of buffer layer 14 is then removed to form a sacrificial mask 24 overlying a portion 26 of major surface 13. Sacrificial mask 24 has an opening 28 formed therein which defines an exposed portion 30 of major surface 13, as shown in FIG. 5. Sacrificial mask 24 is a laminate comprising second sacrificial layer 20 and a remaining portion 32 of buffer layer 14. Portion 22 is preferably removed with a selective etchant, such as hydrofluoric acid, so that damage to the underlying substrate's crystal structure is minimized. The significance of using a selective etchant will be made clear later.

Figure 6:
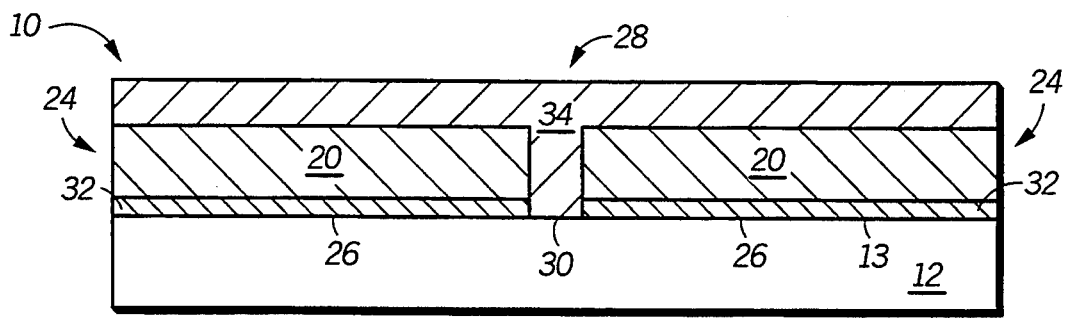

In FIG. 6, a layer of amorphous silicon 34 is then formed using conventional techniques. In accordance with a preferred embodiment, amorphous silicon layer 34 is preferably formed by chemically vapor depositing a layer of amorphous silicon. Alternatively, amorphous silicon layer 34 may be formed by chemically vapor depositing a layer of polycrystalline silicon, and then implanting the polycrystalline layer with silicon ions in order to form an amorphous layer. Furthermore, it is also envisioned that in alternative embodiments of the invention an amorphous material other than silicon may also be used. Amorphous silicon layer 34 overlies sacrificial mask 24 and lies within opening 28 where it abuts portion 30 of major surface 13. In accordance with a preferred embodiment, amorphous silicon layer 34 is deposited such that opening 28 is substantially filled, as shown in FIG. 6.

Figure 7:
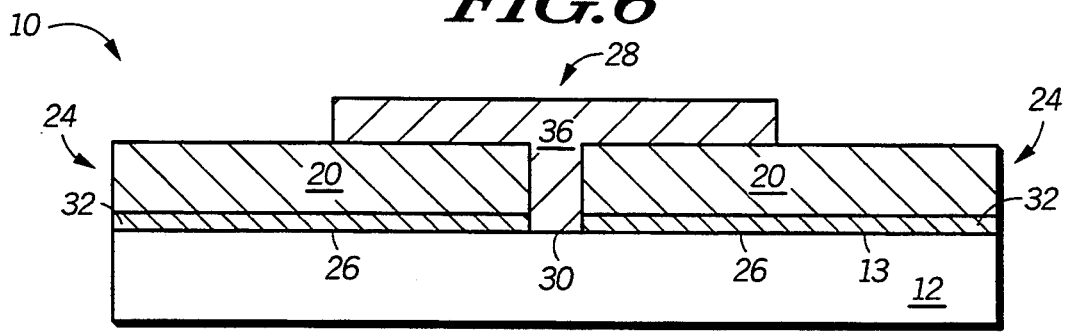

In FIG. 7, amorphous silicon layer 34 is then patterned using standard photolithographic patterning and etching processes to form a remaining portion 36. As shown in FIG. 7, remaining portion 36 overlies a portion of sacrificial mask 24 and is formed such that it also overlies opening 28, as shown in FIG. 7. Alternatively, if polysilicon is used to form amorphous silicon layer 34, then it may be patterned prior to implantation.

Figure 8:
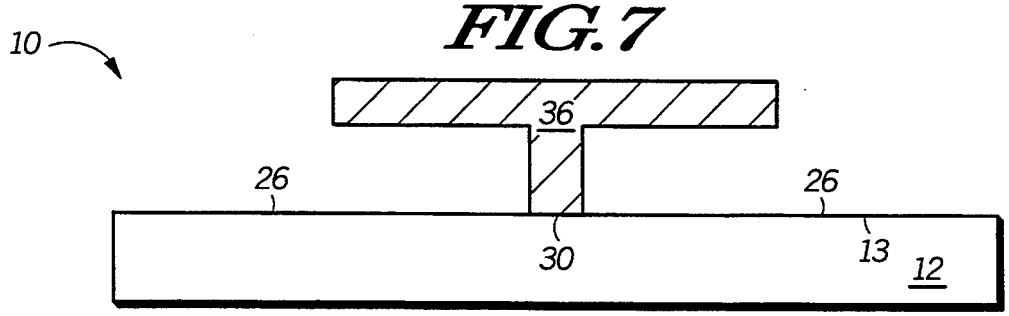

In FIG. 8, sacrificial mask 24 is then selectively removed to expose portion 26 of major surface 13. This results in remaining portion 26 being in direct contact with only semiconductor substrate 12, as shown in FIG. 8. In accordance with a preferred embodiment, sacrificial mask 24 is removed using a hydrofluoric acid solution.

Figure 9:
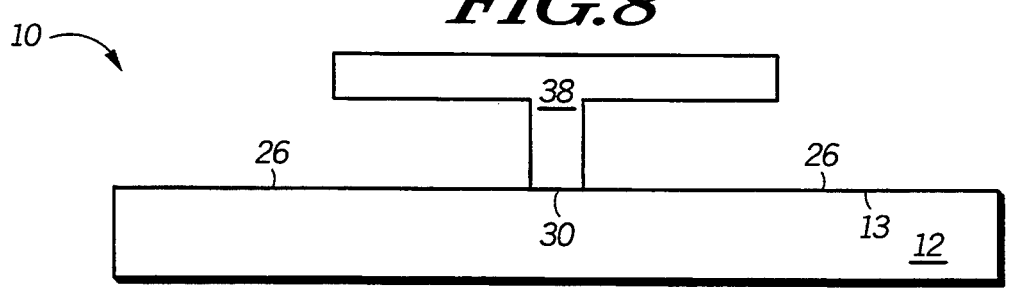

In FIG. 9, remaining portion 36 is then annealed to form an epitaxial layer 38 of monocrystalline silicon. Remaining portion 36 may be annealed in a conventional furnace or in a lamp annealing system. Alternatively, remaining portion 36 may also be annealed with a laser, or an electron beam. Epitaxial silicon layer 38 is formed by solid phase epitaxial re-growth and portion 30 of major surface 13 serves as a seed site for the re-growth process. Because remaining portion 36 is in direct contact with only the seed area, epitaxial re-growth occurs in a uniform manner and therefore the resulting layer of semiconducting material, or SOI film, has a low density of crystal defects. In addition, since crystal damage to the seed area is minimized by the previously described selective etch, the defectivity of the resulting SOI film is also improved because the crystal quality of the epitaxial layer is also dependent upon crystal defects present in the seed area.

Figure 10:
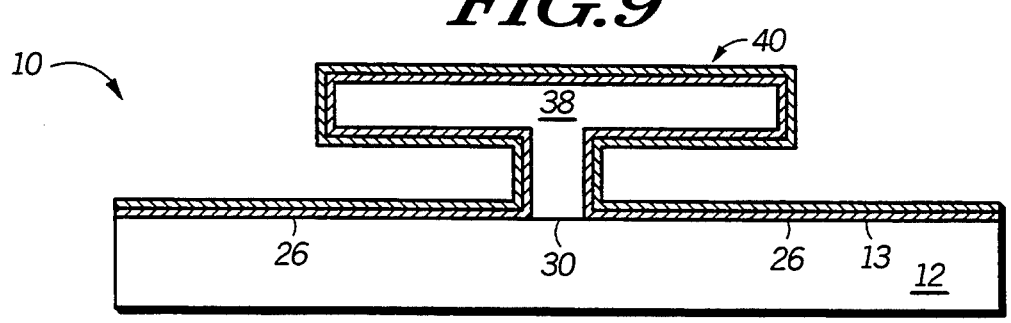

In FIG. 10, a passivation layer 40 is then formed overlying portion 26 of major surface 13 and abuts epitaxial silicon layer 38. In a preferred embodiment passivation layer 40 has a thickness of less than 100 nanometers and is a composite layer comprising a layer of silicon nitride overlying a layer of thermal silicon dioxide. Surface portions of semiconductor substrate 12 and epitaxial silicon layer 38 are first thermally oxidized to form the layer of thermal silicon dioxide. A layer of silicon nitride is then subsequently formed adjacent to the layer of thermal silicon dioxide using standard deposition techniques. Passivation layer 40 passivates dangling silicon bonds present along the surface of epitaxial silicon layer 38, and thus devices subsequently formed with epitaxial silicon layer 38 have improved electrical characteristics.

Figure 11:
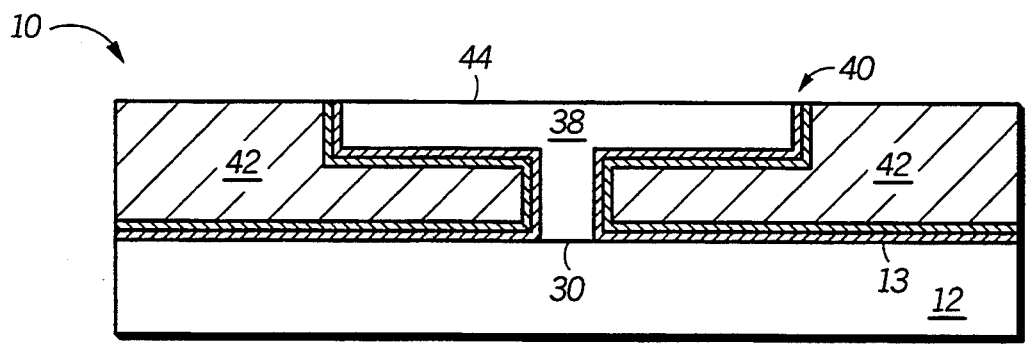

In FIG. 11, a dielectric layer 42 is deposited and subsequently planarized such that a portion of passivation layer 40 is exposed. Dielectric layer 42 is preferably silicon dioxide and may be deposited using conventional techniques such as chemical vapor deposition, plasma enhanced chemical vapor deposition, spin on deposition, or the like. In addition, dielectric layer 42 may be planarized using conventional plasma etching or chemical mechanical polishing techniques, or a combination thereof. Moreover, during the planarization process, passivation layer 40 may also be advantageously used as an etch stop or polish stop. After planarization, the exposed portion of passivation layer 40 is then subsequently removed to expose an underlying portion 44 of epitaxial silicon layer 38, as shown in FIG. 11. The exposed portion of passivation layer 40 may be removed using conventional wet or dry etching techniques, or a combination thereof. In addition, although not illustrated, certain deposition processes may also result in the formation of a void in a portion of the dielectric layer that underlies epitaxial silicon layer 38. However, this will not adversely effect the performance of semiconductor devices subsequently formed with epitaxial silicon layer 38.

Figure 12:
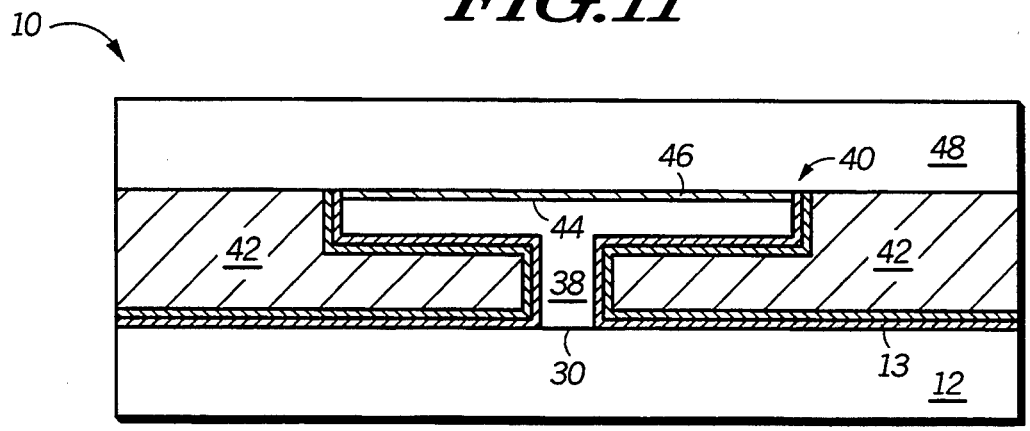

In FIG. 12, a gate dielectric layer 46 is then formed overlying portion 44 of epitaxial silicon layer 38. Gate dielectric layer 46 is preferably silicon dioxide that is formed by thermal oxidation. Alternatively, gate dielectric layer 46 may be chemically vapor deposited silicon dioxide or another material such as silicon oxynitride. A conductive layer 48 of material is then subsequently formed overlying gate dielectric layer 46. In accordance with a preferred embodiment, conductive layer 48 is preferably a layer of chemically vapor deposited polysilicon. Alternatively, conductive layer 48 may be a refractory metal, such as tungsten or molybdenum, or it may be a laminated structure comprising a refractory metal silicide layer, such as tungsten silicide, cobalt silicide, or titanium silicide, overlying a polysilicon layer.

Figure 13:
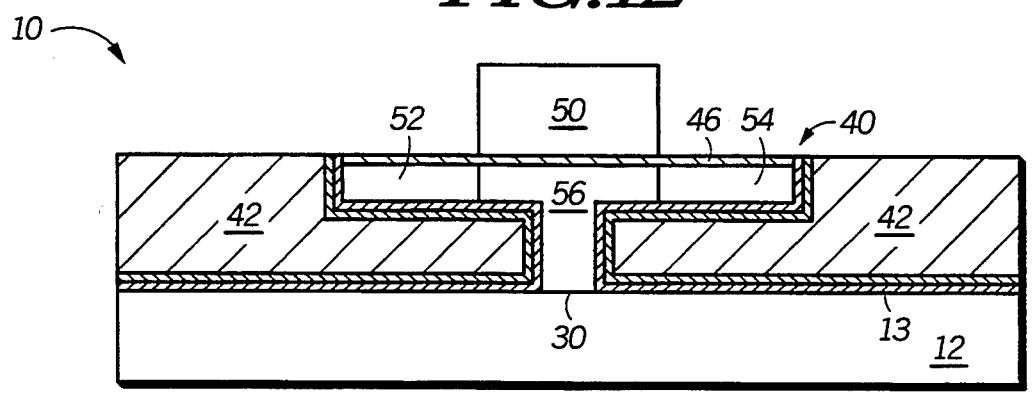

In FIG. 13, Conductive layer 48 is patterned using conventional photolithographic patterning and etching techniques to form a transistor gate electrode 50. Transistor gate electrode 50 is then used as an ion implantation mask and a doped source region 52 and a doped drain region 54 are formed within portions of epitaxial layer 38 that overlie dielectric layer 42. In addition, this process also defines a channel region 56 that lies in between source region 52 and drain region 54, as shown in FIG. 13. Moreover, channel region 56 is also defined such that it overlies portion 30 of major surface 13. Therefore, channel region 56 is electrically coupled to semiconductor substrate 12. Therefore, the resulting semiconductor device has a non-floating channel region, and thus it will not exhibit the well known "kink" effect associated with floating channel devices. Moreover, passivation layer 40 passivates dangling bonds underlying the channel region, and therefore parasitic device leakage is minimized.

Figure 14:
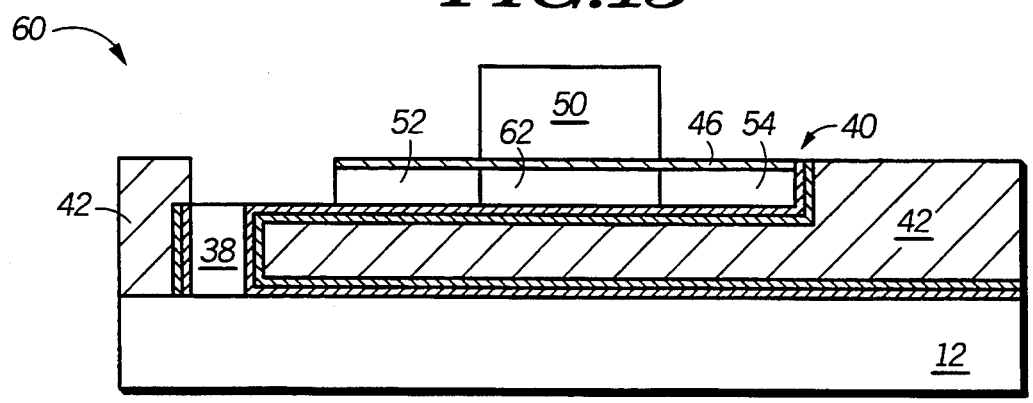
FIG. 14 illustrates, in cross-section a device structure in accordance with an alternative embodiment of the invention

FIG. 14 illustrates an alternative embodiment of the invention wherein a semiconductor device is formed with a floating channel region. Shown in FIG. 14, is a portion 60 of an integrated circuit structure wherein transistor gate electrode 50 is formed such that it does not overlie the opening that extends through dielectric layer 42. As previously described, source region 52 and drain region 54 are then subsequently formed by ion implantation. Similarly, this process also defines a channel region 62 that lies in between source region 52 and drain region 54. However, unlike channel region 56 of FIG. 13, channel region 62 does not overlie the opening in dielectric layer 42, and therefore it is not electrically coupled to semiconductor substrate 12. In addition, a portion of epitaxial silicon layer 38 may be removed, using conventional etch techniques, so that source region 52 is electrically isolated from semiconductor substrate 12, as shown in FIG. 14. This etch step may be performed either before gate dielectric layer 46 is formed or after it is formed, as shown in FIG. 14. Alternatively, in some applications source region 52 may remain coupled to semiconductor substrate 12.

The foregoing description and illustrations contained herein demonstrate many of the advantages associated with the present invention. In particular, it has been revealed that a SOI film having a low crystal defectivity may be fabricated by forming an amorphous silicon layer in direct contact only with an epitaxial seed region, and then subsequently annealing it. As a result, semiconductor devices with improved electrical characteristics may be formed with this SOI film because of its improved crystal quality. Moreover, formation of a passivation layer under at least a portion of the epitaxial SOI film also improves the performance of semiconductor devices subsequently formed with the film. For example, formation of a passivation layer under the channel region of an MOS transistor passivates dangling bonds in that region, and thus reduces parasitic device leakage.

Thus it is apparent that there has been provided, in accordance with the invention, a method for forming a semiconducting material and a device therein that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the positional relationship of source region 52 with respect to drain region 54, as shown in FIGS. 13 and 14, is merely illustrative and their respective positions may be interchanged with one another. In addition, although the fabrication of an MOS transistor was specifically described the invention is not limited only to MOS devices. Transistors, resistors, diodes, and bipolar devices may also be formed using this invention. Therefore, it is intended that this invention encompass all such variations and modifications as fall within the scope of the appended claims.

We claim:

1. A method for forming a semiconductor device comprising the steps of:
   providing a semiconductor substrate, the semiconductor substrate having a major surface;
   forming a sacrificial mask overlying a first portion of the major surface, the sacrificial mask having an opening formed therein which defines a second exposed portion of the major surface;
   forming a layer of amorphous silicon, wherein the layer of amorphous silicon overlies the sacrificial mask and lies within the opening, the layer of amorphous silicon abutting the second exposed portion of the major surface;
   patterning the layer of amorphous silicon;
   removing the sacrificial mask after the layer of amorphous silicon has been patterned;
   annealing the layer of amorphous silicon to form an epitaxial silicon layer, wherein the epitaxial silicon layer is formed after the sacrificial mask has been removed; and
   forming a doped region within the epitaxial silicon layer.

2. The method of claim 1, wherein the step of forming the layer of amorphous silicon comprises chemically vapor depositing a layer of amorphous silicon.

3. The method of claim 1, wherein the step of forming the layer of amorphous silicon comprises chemically vapor depositing a layer of polysilicon.

4. The method of claim 3 further comprising the step of ion implanting the layer of polysilicon to form the layer of amorphous silicon.

5. The method of claim 1, wherein the step of annealing the layer of amorphous silicon comprises using at least one apparatus selected from a group consisting of a furnace, a lamp, a laser, and an electron beam.

6. The method of claim 1 further comprising the step of forming a passivation layer abutting the epitaxial silicon layer.

7. The method of claim 6, wherein the step of forming the passivation layer comprises thermally oxidizing a portion of the epitaxial silicon layer to form a layer of silicon dioxide.

8. The method of claim 7, further comprising the step of forming a layer of silicon nitride adjacent to the layer of silicon dioxide to form the passivation layer.

9. A method for forming a semiconducting layer of material comprising the steps of:

providing a semiconductor substrate, the semiconductor substrate having a major surface;

forming a sacrificial mask overlying a first portion of the major surface, the sacrificial mask having an opening therein which defines a second exposed portion of the major surface;

forming a layer of amorphous material, wherein the layer of amorphous material overlies the sacrificial mask and lies within the opening, the layer of amorphous material abutting the second exposed portion of the major surface;

patterning the layer of amorphous material;

removing the sacrificial mask after the layer of amorphous material has been patterned; and annealing the layer of amorphous material to form an epitaxial semiconductive layer, wherein the epitaxial semiconductive layer is formed after the sacrificial mask has been removed.

10. The method of claim 9, wherein the step of forming the layer of amorphous material comprises chemically vapor depositing a layer of amorphous silicon.

11. The method of claim 9, wherein the step of forming the layer of amorphous material comprises chemically vapor depositing a layer of polysilicon.

12. The method of claim 11 further comprising the step of ion implanting the layer of polysilicon to form the layer of amorphous material.

13. The method of claim 9, wherein the step of annealing the layer of amorphous material comprises using at least one apparatus selected from a group consisting of a furnace, a lamp, a laser, and an electron beam.

* * * * *